(12) United States Patent
Pu et al.

(10) Patent No.: US 7,871,860 B1
(45) Date of Patent: Jan. 18, 2011

(54) METHOD OF SEMICONDUCTOR PACKAGING

(75) Inventors: Han-Ping Pu, Taichung (TW); Tsung-Shu Lin, Yonghe (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/620,321

(22) Filed: Nov. 17, 2009

(51) Int. Cl.
*H01L 21/00* (2006.01)
*H01L 21/50* (2006.01)
*H01L 21/48* (2006.01)
*H01L 21/44* (2006.01)
*H01L 21/46* (2006.01)

(52) U.S. Cl. .................. 438/118; 438/51; 438/106; 438/107; 438/108; 438/455; 257/E21.499; 257/E21.501; 257/E21.503; 257/E21.512

(58) Field of Classification Search .......... 257/E21.499, 257/E21.501, E21.503, E21.512
See application file for complete search history.

(56) References Cited

U.S. PATENT DOCUMENTS

| 5,869,886 | A * | 2/1999 | Tokuno ................... 257/678 |
| 7,190,082 | B2 | 3/2007 | Nagarajan et al. |
| 7,193,007 | B2 | 3/2007 | Cheng et al. |
| 2002/0072151 | A1 * | 6/2002 | Amami et al. ............ 438/108 |
| 2007/0108634 | A1 * | 5/2007 | Higashi et al. ........... 257/787 |

\* cited by examiner

*Primary Examiner*—Savitri Mulpuri
*Assistant Examiner*—Mohsen Ahmadi
(74) *Attorney, Agent, or Firm*—Haynes and Boone, LLP

(57) ABSTRACT

The present disclosure provides a method of fabricating a semiconductor device. The method includes providing a chip and a substrate. The method also includes bonding the chip to the substrate. The method also includes, after the bonding the chip, dispensing a sealing material between the chip and the substrate. In accordance with the method, the chip and the substrate are maintained within a temperature range from the bonding the chip to the dispensing the sealing material, and wherein a lower limit of the temperature range is approximately twice a room temperature.

17 Claims, 4 Drawing Sheets

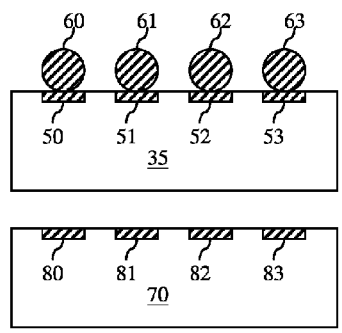
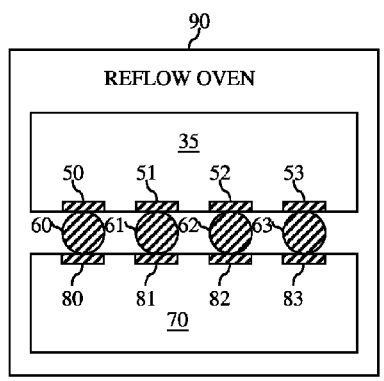
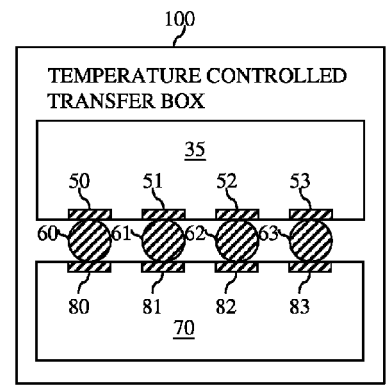
Fig. 2A
Fig. 2B
Fig. 2C
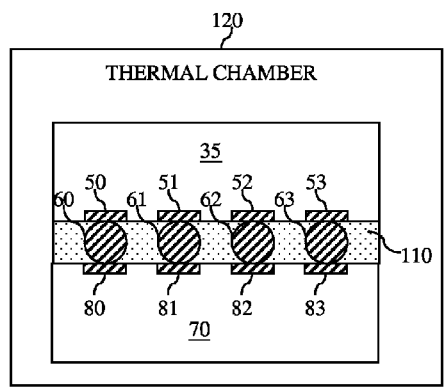
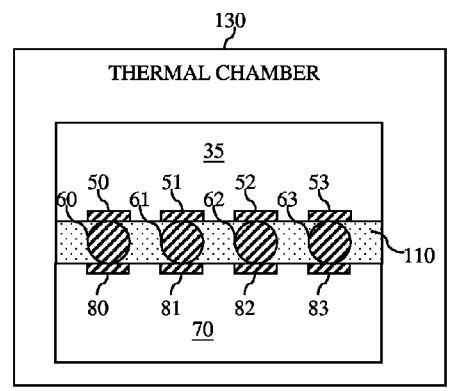
Fig. 2D
Fig. 2E

METHOD OF SEMICONDUCTOR PACKAGING

TECHNICAL FIELD

The present disclosure relates generally to a method of fabricating a semiconductor device, and more particularly, to a method of semiconductor packaging.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased. As geometry size gets smaller, the packaging process of ICs becomes more challenging. One of the current packaging processes employs a "flip chip" technology, where an IC is flipped and bonded with an external substrate. However, temperature fluctuations in existing flip chip bonding processes may result in excessive thermal stress, which may then lead to delamination or cracking of the IC.

Therefore, while existing methods of semiconductor packaging have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A-2E are diagrammatic cross sectional side views of the semiconductor device and the substrate at various stages of a bonding process in accordance with an embodiment of the method of FIG. 1;

SUMMARY

Figure 1:
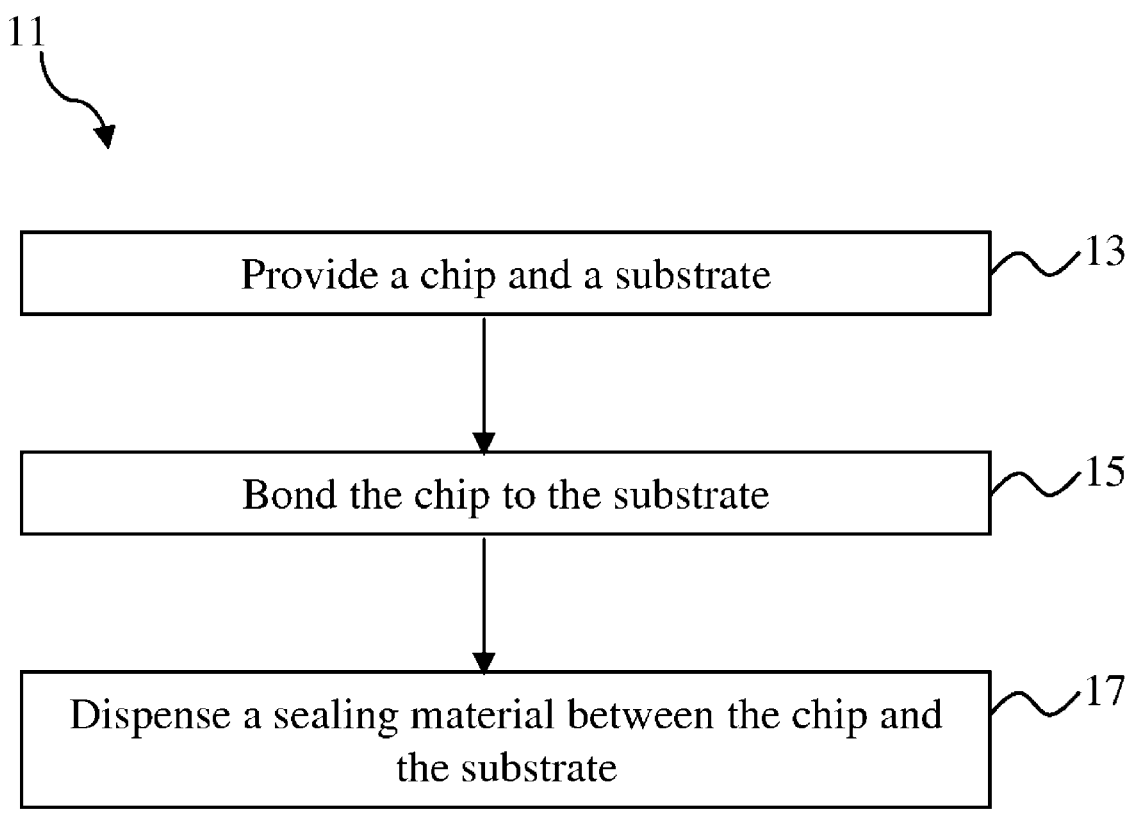
FIG. 1 is a flowchart illustrating a method of bonding a semiconductor device to a substrate according to various aspects of the present disclosure.

One of the broader forms of the present disclosure involves a method of fabricating a semiconductor device. The method includes, providing a chip and a substrate; bonding the chip to the substrate; and thereafter dispensing a sealing material between the chip and the substrate; wherein the chip and the substrate are maintained within a temperature range from the bonding the chip to the dispensing the sealing material, and wherein a lower limit of the temperature range is approximately twice a room temperature.

Another of the broader forms of the present disclosure involves a method of fabricating a semiconductor device. The method includes, providing a semiconductor chip and an external substrate; subjecting the semiconductor chip and the substrate to a first range of temperatures from a first point in time to a second point in time; bonding the semiconductor chip to the substrate, the bonding occurring between the first and second points in time; subjecting the semiconductor chip and the substrate to a second range of temperatures from the second point in time to a third point in time; and sealing a space between the semiconductor chip and the substrate with an underfill material, the sealing occurring between the second and third points in time; wherein each of the temperatures of the first and second ranges is greater than approximately twice a room temperature.

Still another of the broader forms of the present disclosure involves a method of fabricating a semiconductor device. The method includes, providing a substrate that is external to the semiconductor device; placing the semiconductor device on the substrate, thereby forming an interface between the semiconductor device and the substrate; bonding the semiconductor device to the substrate through a heating process; after the bonding, cooling the semiconductor device and the substrate; and after the cooling, filling the interface with a sealant; wherein temperatures of the semiconductor device and the substrate are no less than approximately twice a room temperature between the bonding and the filling.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 3A:
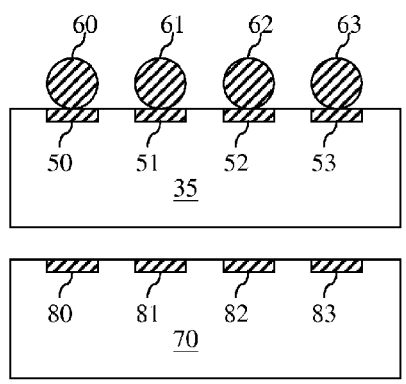
FIGS. 3A-3C are diagrammatic cross sectional side views of the semiconductor device and the substrate at various stages of a bonding process in accordance with another embodiment of the method of FIG. 1.
Figure 3B:
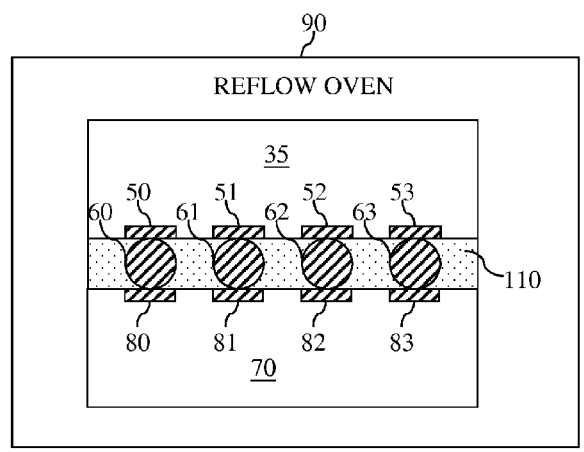
Figure 3C:
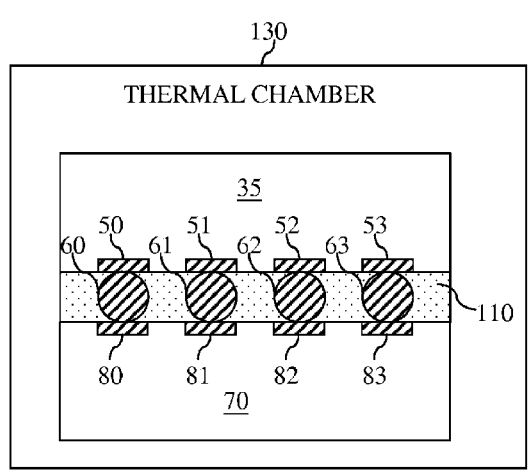

FIG. 1 is a flowchart of a method 11 for bonding a semiconductor device to a substrate. FIGS. 2A-2E are diagrammatic fragmentary cross sectional side views of the semiconductor device and the substrate during various stages of the flip chip bonding process in accordance with an embodiment of the method of FIG. 1. FIGS. 3A-3C are diagrammatic fragmentary cross sectional side views of the semiconductor device and the substrate during various stages of a flip chip bonding process in accordance with an alternative embodiment of the method of FIG. 1. It is understood that FIGS. 2-3 have been simplified for a better understanding of the inventive concepts of the present disclosure. Accordingly, it should be noted that additional processes may be provided before, during, and after the method 11 of FIG. 1, and that some other processes may only be briefly described herein.

Referring to FIG. 1, the method 11 begins with block 13 in which a chip and an external substrate is provided. The method 11 continues with block 15 in which the chip is bonded to the substrate using a flip chip bonding process, in which a chip is flipped and bonded to the substrate. The method 11 continues with block 17 in which a sealing material is dispensed between the chip and the substrate. A predetermined range of temperatures is maintained from block 15 to block 17. Alternatively stated, the predetermined range of temperatures is maintained from the bonding of the chip (to the substrate) to the dispensing of the sealing material.

Referring now to FIG. 2A, a semiconductor device 35 (also referred to as a chip or a die) is provided. The semiconductor device 35 may be an integrated circuit (IC) chip, system on chip (SoC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

The semiconductor device 35 includes a wafer (not illustrated), which is a semiconductor wafer in the present embodiment. For example, the wafer may be a silicon wafer. The wafer may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. A plurality of doped regions (not illustrated) are formed in the wafer.

The semiconductor device 35 also has an interconnect structure (not illustrated) formed over the wafer. The interconnect structure includes a plurality of patterned dielectric layers and conductive layers that provide interconnections (e.g., wiring) between the various doped regions formed in the wafer. The interconnect structure includes an interlayer dielectric (ILD), which includes an insulating dielectric material such as a low-k material. The low-k material can be defined as a dielectric material having its dielectric constant less than about 3.9, that of a thermal silicon oxide. The low-k materials may comprise carbon-doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other materials. The ILD may be formed by spin coating. In other embodiments, the ILD may include silicon oxide, silicon nitride, fluorosilicate glass (FSG), combinations thereof, or another suitable insulating material, and may be formed by CVD, PVD, ALD, or combinations thereof.

A plurality of bonding pads 50-53 are formed over the interconnect structure. The bonding pads 50-53 are formed of conductive materials. In an embodiment, the bonding pads 50-53 may include an under-bump-metallization (UBM) structure. The UBM structure may include various layers (for example, various layers of metal) that provide adequate adhesion to the bonding pads 50-53 and protection for the underlying materials. Solder balls (also referred to as solder bumps) 60-63 are formed on the bonding pads 50-53, respectively. The solder balls 60-63 may be formed by evaporation, electroplating, printing, jetting, stud bumping, or other suitable techniques. The solder balls 60-63 include a conductive material, for example, lead. The UBM structure also provides wetting for the solder balls 60-63.

FIG. 2A also illustrates a substrate 70 that is external to the semiconductor device 35. The substrate 70 may be a printed circuit board (PCB). The substrate 70 has a plurality of bonding pads 80-83 that are similar to the bonding pads 50-53.

Referring to FIG. 2B, the semiconductor device is "flipped" upside down (vertically rotated 180 degrees) and placed on the substrate 70. The solder balls 60-63 are aligned with and come into contact with the bonding pads 80-83. Thereafter, the solder balls 60-63 are melted to produce electrical coupling between the substrate 70 and the semiconductor device 35. The solder balls 60-63 are melted in a reflow oven 90 (also referred to as a furnace) using a reflow process. The temperatures at which the solder balls 60-63 are melted are referred to as reflow temperatures. The reflow temperatures range from approximately 200 degrees Celsius to approximately 260 degrees Celsius.

A traditional flux material (not illustrated) is applied on the bonding pads 80-83 and/or on the bonding pads 50-53 to facilitate the bonding between the semiconductor device 35 and the substrate 70. The traditional flux material may include tin or rosin and acts as a wetting agent in the reflow process, reducing the surface tension of the molten solder balls 60-63 and causing it to better wet out the bonding pads 50-53 and 80-83. The use of the traditional flux material leaves a corrosive residue, which needs to be cleaned in a later flux cleaning process.

Traditionally, the flux cleaning process is performed after the semiconductor device 35 and the substrate 70 are taken out of the reflow oven and cooled to room temperature (between approximately 23 degrees Celsius to approximately 27 degrees Celsius). As the semiconductor device 35 and the substrate 70 undergo a temperature change from approximately 200-260 degrees Celsius to approximately room temperature, the semiconductor device and the substrate will contract at rates that are dependent on their respective coefficients of thermal expansion (CTE). Often times, there is a mismatch between the CTE of the semiconductor device 35 and the CTE of the substrate 70. This mismatch of the CTEs means that the semiconductor device 35 and the substrate 70 are contracting at different rates, which causes stress between the semiconductor device and the substrate. This stress can cause cracking or delamination of one or more layers of the semiconductor device 35—for example, delamination or cracking of the low-k material layer. Further, the solder balls 60-63 may also suffer from cracking or delamination as the stress becomes sufficiently great.

In this embodiment, however, the semiconductor device 35 and the substrate 70 are not cooled to room temperature in the flux cleaning process. Referring to FIG. 2C, the semiconductor device 35 and the substrate 70 are directly placed inside a temperature controlled transfer box 100 after being taken out of the reflow oven 90. As such, the semiconductor device 35 and the substrate 70 are never exposed to air that is at, or close to, room temperature. The temperatures inside the transfer box 100 is controlled to be greater than approximately twice the room temperature. For instance, the temperatures of the transfer box 100 are controlled to be ranging from approximately 65 degrees Celsius to approximately 75 degrees Celsius. Thus, the temperature drop from inside the reflow oven 90 to the transfer box 100 is reduced in comparison with the traditional process. Consequently, the stress between the semiconductor device 35 and the substrate 70 is reduced as well, and no significant delamination or cracking of the semiconductor device 35 (or the solder balls 60-63) should occur in this case.

Referring now to FIG. 2D, an underfill material 110 is dispensed to fill the empty space in between the semiconductor device 35 and the substrate 70, the space also being referred to as a bonding interface. The underfill dispensing process takes place inside a thermal chamber 120. The thermal chamber 120 has controlled temperatures that range from approximately 70 degrees Celsius to approximately 120 degrees Celsius. The thermal chamber 120 is a stand-alone fabrication tool in this embodiment. In alternative embodiments, depending on manufacturing capabilities and concerns, the reflow oven 90 or a similar tool may be used to implement the thermal chamber 120.

Referring back to FIG. 2D, the underfill material 110 is an adhesive material. In an embodiment, the underfill material 110 includes a liquid epoxy containing $SiO_2$. The underfill material 110 has a glass transition temperature $T_g$ that is in a range from approximately 70 degrees Celsius to approximately 140 degrees Celsius. The underfill material 110 has a CTE that is in a range from approximately 25 parts-per-million (ppm) to approximately 45 ppm. The underfill material 110 has an elastic modulus that is in a range from approximately 7 giga-pascals (GPa) to approximately 12 GPa. The underfill material 110 serves as a sealant to prevent exposure of the surfaces of the semiconductor device 35 and the substrate 70, and thus prevents corrosion of the semiconductor device and the substrate. Furthermore, the underfill material 110 acts as a cushion to absorb and alleviate stress between the semiconductor device 35 and the substrate 70 during various thermal processes that may follow.

Referring now to FIG. 2E, the underfill material 110 is cured in an underfill curing process, so as to harden or toughen the underfill material. The underfill curing process takes place inside a thermal chamber 130. The thermal chamber 130 has controlled temperatures that range from approximately 150 degrees Celsius to approximately 175 degrees Celsius. The thermal chamber 130 is a stand-alone fabrication tool in this embodiment. In alternative embodiments, depending on manufacturing capabilities and concerns, the reflow oven 90 or a similar tool may be used to implement the thermal chamber 130.

Once the underfill material 110 has been dispensed in between the semiconductor device 35 and the substrate 70, stress created due to mismatches of the CTE between the semiconductor device and the substrate becomes less of a crucial concern. Part of the reason is that, as discussed above, the underfill material 110 acts as a cushion to relieve the stress. Hence, cracking or delamination of layers within the semiconductor device 35 is less likely to occur.

As discussed above, FIGS. 3A-3C are diagrammatic fragmentary cross sectional side views of the semiconductor device 35 and the substrate 70 during various stages of the flip chip bonding process in accordance with an alternative embodiment. In this embodiment, many of the components and fabrication tools are similar to the components and tools of the embodiment described above with reference to FIGS. 2A-2E. Accordingly, similar features in FIGS. 3A-3C and FIGS. 2A-2E are labeled the same for the sake of clarity and consistency.

Referring to FIG. 3A, the semiconductor device 35 is provided. The semiconductor device 35 has bonding pads 50-53 and solder balls 60-63. Referring now to FIG. 3B, the semiconductor 35 and the substrate 70 are bonded in a manner similar to the flip chip bonding process described above with reference to FIG. 2B. However, a "no-clean" type of flux material is used during the flip chip bonding process to facilitate bonding. Unlike the traditional flux material described above with reference to FIG. 2B, this no-clean type of flux material either leaves a residue that is not sufficiently corrosive or does not leave a substantial amount of residue at all. As such, no cleaning of the flux material is required. After the bonding, the underfill material 110 is dispensed to fill the empty space between the semiconductor device 35 and the substrate 70. The underfill dispensing process takes place inside the same reflow oven 90 that is used for the bonding process. The temperatures inside the reflow oven 90 are altered to the temperatures suitable for the underfill dispensing process, which are greater than at least twice the room temperature. In an embodiment, the temperatures inside the reflow oven 90 are altered to be ranging from approximately 70 degrees Celsius to approximately 120 degrees Celsius. Since the semiconductor device 35 and the substrate 70 are never taken outside the reflow oven 90, the temperatures of the semiconductor device and the substrate never cool down close to room temperature. Consequently, the semiconductor device 35 and the substrate 70 do not experience drastically different rates of expansion or contraction, and thus stress between the semiconductor device and the substrate is reduced.

Referring now to FIG. 3C, the underfill material 110 is cured in a manner similar to the curing process described above with reference to FIG. 2E.

Figure 4A:
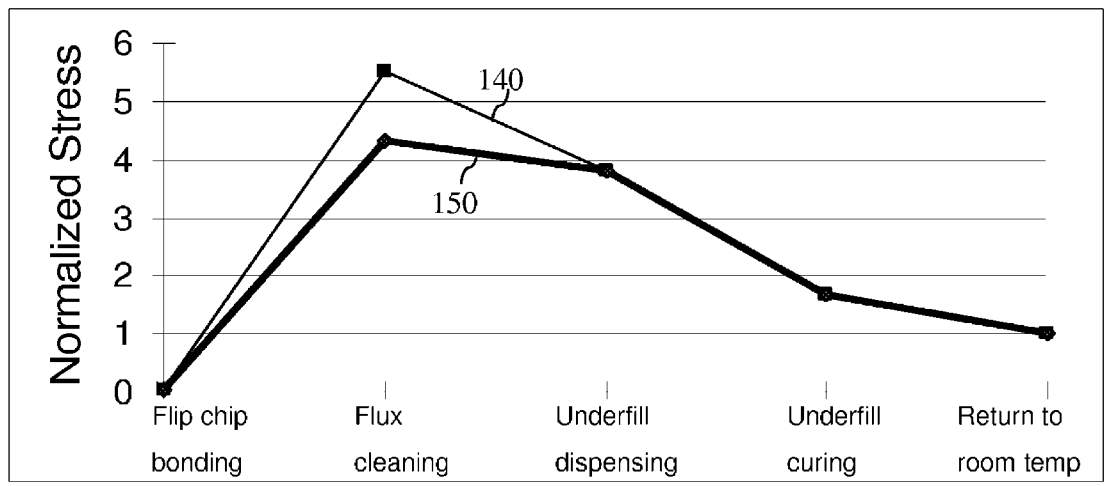
FIG. 4A is a graph illustrating the stress between the semiconductor device and the substrate at the various stages of a baseline bonding process and the bonding process of FIGS. 2A-2E.

FIG. 4A is a graph illustrating the stress reduction achieved by the method (hereinafter referred to as method 1) described with reference to FIGS. 2A-2E in comparison with a baseline flip chip bonding process. Specifically, a stress 140 between the semiconductor device 35 and the substrate 70 at the various processing stages for the baseline flip chip bonding process is plotted as a line in FIG. 4A, and a stress 150 between the semiconductor device 35 and the substrate 70 at the various processing stages for the flip chip bonding process of method 1 is plotted as another line in FIG. 4A. At the bonding stage, the temperatures for both the baseline process and method 1 are set to an exemplary value of approximately 220 degrees Celsius. The stress 140 and the stress 150 are both normalized to a value of 0. At the flux cleaning stage, the temperature drops from 220 degrees Celsius to approximately 25 degrees Celsius for the baseline process. Due to this relatively large drop, the stress 140 rises to a normalized value of approximately 5.53. In comparison, for the process of method 1, the temperature remains at above approximately 70 degrees Celsius as the process transitions from the bonding stage to the flux cleaning stage. Consequently, the stress 150 is at a normalized value of approximately 4.33, which amounts to a reduction that is close to 22% compared to the baseline process.

At the underfill dispensing stage, the temperatures for both the baseline process and the process of method 1 are set to an exemplary value of approximately 90 degrees Celsius. The stress 140 and the stress 150 at this stage each have a normalized value of approximately 3.8. At the underfill curing stage, the temperatures for both the baseline process and the process of method 1 are set to an exemplary value of approximately 160 degrees Celsius. As discussed above, the underfill material 110 serves to alleviate stress between the semiconductor device 35 and the substrate 70. Consequently, the stress 140 and the stress 150 each have a further reduced normalized value of approximately 1.66. Lastly, as the flip chip bonding processes come to an end and both the semiconductor device 35 and the substrate 70 are cooled to an exemplary room temperature of approximately 25 degrees Celsius, the stress 140 and the stress 150 each approach a normalized value of approximately 1.

Figure 4B:
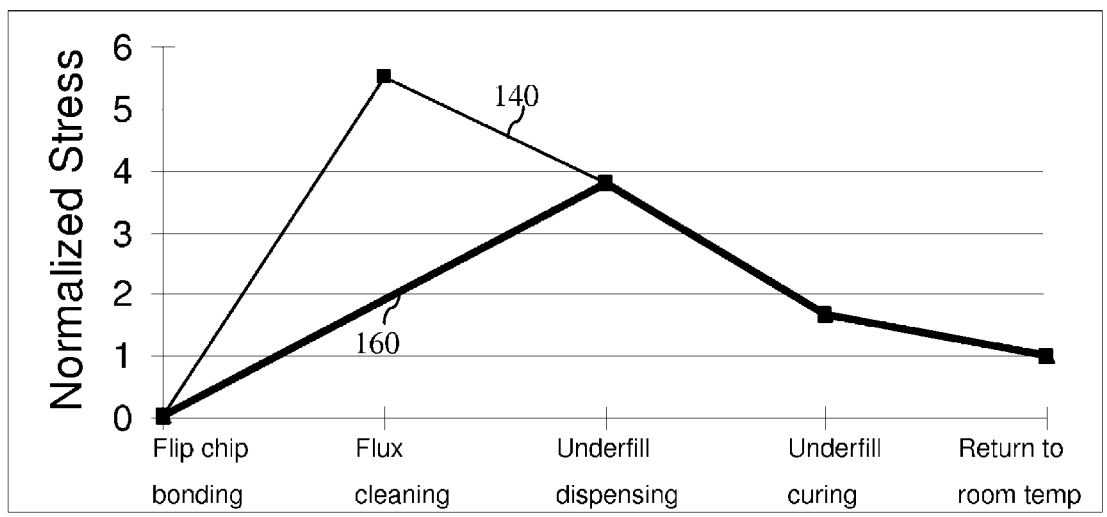
FIG. 4B is a graph illustrating the stress between the semiconductor device and the substrate at the various stages of a baseline bonding process and the bonding process of FIGS. 3A-3C.

FIG. 4B is a graph illustrating the stress reduction achieved by the method (hereinafter referred to as method 2) described with reference to FIGS. 3A-3C in comparison with the baseline flip chip bonding process described above with reference to FIG. 4A. Specifically, a stress 160 between the semiconductor device 35 and the substrate 70 at the various processing stages for the flip chip bonding process of method 2 is plotted as a line in FIG. 4B. At the bonding stage, the temperatures for both the baseline process and method 2 are set to an exemplary value of approximately 220 degrees Celsius. The stress 140 and the stress 160 are both normalized to a value of 0. At the flux cleaning stage for the baseline process, the temperature drops from 220 degrees Celsius to approximately 25 degrees Celsius, and the stress 140 rises to a normalized value of approximately 5.53.

As discussed above, the flux material used in method 2 does not require cleaning. Thus, a flux cleaning process is not performed for method 2, and the flip chip bonding process proceeds directly to the underfill dispensing stage. At the underfill dispensing stage, the temperatures for both the baseline process and the process of method 2 are set to an exemplary value of approximately 90 degrees Celsius. The stress 140 and the stress 160 at this stage each have a normalized value of approximately 3.8. Compared to the stress 140 of 5.33 at its peak for the baseline process, the stress 160 associated with method 2 is reduced by approximately 31%. At the underfill curing stage, the temperatures for both the baseline process and the process of method 2 are set to an exemplary value of approximately 160 degrees Celsius. As discussed above, the underfill material 110 serves to alleviate stress between the semiconductor device 35 and the substrate 70. Consequently, the stress 140 and the stress 150 each have a further reduced normalized value of approximately 1.66. Lastly, as the flip chip bonding processes come to an end and both the semiconductor device 35 and the substrate 70 are cooled to the exemplary room temperature of approximately 25 degrees Celsius, the stress 140 and the stress 150 each approach a normalized value of approximately 1.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
   providing a chip and a substrate;
   bonding the chip to the substrate; and
   thereafter dispensing a sealing material between the chip and the substrate, wherein the sealing material has:
      a glass transition temperature that is within a range from approximately 70 degrees Celsius to approximately 140 degrees Celsius;
      a coefficient of thermal expansion that is within a range from approximately 25 parts per million to approximately 45 parts per million; and
      an elastic modulus that is within a range from approximately 7 giga-pascals to approximately 12 giga-pascals;
   wherein the chip and the substrate are maintained within a temperature range from the bonding the chip to the dispensing the sealing material, and wherein a lower limit of the temperature range is approximately twice a room temperature.

2. The method of claim 1, wherein the lower limit of the temperature range is approximately 70 degrees Celsius.

3. The method of claim 1, wherein the bonding the chip comprises a flip chip bonding process.

4. The method of claim 1, wherein the bonding the chip and the dispensing the sealing material are carried out inside a single semiconductor fabrication tool.

5. The method of claim 4, wherein the bonding the chip comprises facilitating the bonding with a flux material that does not require cleaning.

6. The method of claim 1, wherein the providing substrate is carried out so that the substrate has a bonding pad, and further comprising:
   applying a flux material to the bonding pad;
   after the bonding, cleaning the flux material, the cleaning being carried out in a temperature controlled semiconductor fabrication tool that maintains a temperature greater than approximately twice the room temperature; and
   after the dispensing, curing the sealing material.

7. The method of claim 6, wherein:
   the bonding the chip is carried out under temperatures ranging from approximately 200 degrees Celsius to approximately 260 degrees Celsius;
   the dispensing the sealing material is carried out under temperatures ranging from approximately 70 degrees Celsius to approximately 120 degrees Celsius; and
   the curing the sealing material is carried out under temperatures ranging from approximately 150 degrees Celsius to approximately 175 degrees Celsius.

8. The method of claim 6, wherein the temperature maintained in the temperature controlled semiconductor fabrication tool is within a range from approximately 65 degrees to approximately 75 degrees.

9. A method of fabricating a semiconductor device, comprising:
   providing a semiconductor chip and an external substrate;
   subjecting the semiconductor chip and the substrate to a first range of temperatures from a first point in time to a second point in time, the first range of temperatures ranging from approximately greater than twice the room temperature to approximately 260 degrees Celsius;
   bonding the semiconductor chip to the substrate, the bonding occurring between the first and second points in time;
   subjecting the semiconductor chip and the substrate to a second range of temperatures from the second point in time to a third point in time, the second range of temperatures ranging from approximately greater than twice the room temperature to approximately 120 degrees Celsius; and
   sealing a space between the semiconductor chip and the substrate with an underfill material, the sealing occurring between the second and third points in time;
   wherein each of the temperatures of the first and second ranges is greater than approximately twice a room temperature.

10. The method of claim 9, wherein each of the temperatures of the first and second ranges is greater than approximately 70 degrees Celsius.

11. The method of claim 9, wherein the bonding the semiconductor chip comprises a flip chip bonding process.

12. The method of claim 9, wherein the bonding the semiconductor chip comprises facilitating the bonding with a flux material that does not require cleaning, and wherein the bonding the semiconductor chip and the sealing the space are carried out using a single semiconductor fabrication tool.

13. The method of claim 9, wherein the providing the substrate is carried out so that the substrate has a bonding pad, and further comprises:
applying a flux material to the bonding pad;
after the bonding, cleaning the flux material at a temperature that is greater than approximately 70 degrees Celsius; and
after the sealing the space, curing the underfill material.

14. A method of packaging a semiconductor device, comprising:
providing a substrate that is external to the semiconductor device, wherein the semiconductor device has a plurality of first bonding pads, and the substrate has a plurality of second bonding pads;
placing the semiconductor device on the substrate, thereby forming an interface between the semiconductor device and the substrate, the placing further including:
placing a plurality of solder bumps on the first bonding pads in a manner so that each of the first bonding pads has one of the solder bumps;
vertically rotating the semiconductor device approximately 180 degrees; and
positioning the rotated semiconductor device on the substrate in a manner such that each of the first bonding pads is aligned with one of the second bonding pads, and one of the solder bumps is disposed between each aligned pair of first and second bonding pads;
bonding the semiconductor device to the substrate through a heating process;
after the bonding, cooling the semiconductor device and the substrate; and
after the cooling, filling the interface with a sealant;
wherein temperatures of the semiconductor device and the substrate are no less than approximately twice a room temperature between the bonding and the filling.

15. The method of claim 14, wherein the cooling the semiconductor device is carried out inside a temperature control tool that has a temperature ranging from approximate 65 degrees Celsius to approximately 75 degrees Celsius.

16. The method of claim 14, wherein the bonding the semiconductor device is carried out using a temperature control tool, and the tilling the interface is carried out using the same temperature control tool.

17. The method of claim 14, further comprising:
before the bonding, applying a flux material to one of the semiconductor device and the substrate; and
after the cooling, curing the sealant.

* * * * *